US006800369B2

(12) United States Patent
Gimzewski et al.

(10) Patent No.: US 6,800,369 B2
(45) Date of Patent: Oct. 5, 2004

(54) CRYSTALS COMPRISING SINGLE-WALLED CARBON NANOTUBES

(75) Inventors: James Gimzewski, Santa Monica, CA (US); Reto Schlittler, Schoenenberg (CH); Jin Won Seo, Lausanne (CH)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 10/037,045

(22) Filed: Nov. 9, 2001

(65) Prior Publication Data

US 2002/0130610 A1 Sep. 19, 2002

(30) Foreign Application Priority Data

Nov. 13, 2000 (EP) ............................................. 00124766

(51) Int. Cl.[7] .............................. B32B 1/08; C01B 31/00
(52) U.S. Cl. ..................... 428/408; 428/34.1; 428/446; 428/447; 423/445 R
(58) Field of Search ................................ 428/408, 446, 428/34.1; 423/447.3, DIG. 40, 445 R (56) References Cited

U.S. PATENT DOCUMENTS

| | | | |
|---|---|---|---|
| 5,424,054 A | | 6/1995 | Bethune et al. ............. 423/447 |
| 6,221,330 B1 | * | 4/2001 | Moy et al. ................ 423/447.3 |
| 6,261,532 B1 | * | 7/2001 | Ono ........................ 423/447.3 |
| 6,280,697 B1 | * | 8/2001 | Zhou et al. .................. 423/414 |
| 6,331,209 B1 | * | 12/2001 | Jang et al. ..................... 117/90 |
| 6,359,383 B1 | * | 3/2002 | Chuang et al. ............. 313/496 |
| 6,413,487 B1 | * | 7/2002 | Resasco et al. .......... 423/447.3 |

OTHER PUBLICATIONS

"Fullerene Nanotubes: C1,000,000 and Beyond", Boris I. Yakobson and Richard E. Smalley, American Scientist, vol. 85, pp. 324–337, Jul.–Aug. 1997.
"Carbon Rings and Cages in the Growth of Singled–Walled Carbon Nanotubes", Ching–Hwa Kiang, Journal of Chemical Physics, vol. 113, No. 11, pp. 4763–4766, Sep. 15, 2000.
"Growth of a Single Freestanding Multiwall Carbon Nanotube on Each Nonnickel Dot", Z.F. Ren, Z.P. Huang, D.Z. Wang and J.G. Wen, Applied Physics Letters, vol. 75. No. 8. pp. 1086–1088, Aug. 23, 1999.

* cited by examiner

*Primary Examiner*—Stephen Stein
(74) *Attorney, Agent, or Firm*—F. Chau & Associates, LLC (57) ABSTRACT

The invention is directed to a method of manufacturing single-walled carbon nanotubes comprising the steps of providing on a substrate at least one pillar comprising alternate layers of a first precursor material comprising fullerene molecules and a second precursor material comprising a catalyst, and heating the at least one pillar in the presence of a first magnetic or electric field. It further is directed to a precursor arrangement for manufacturing single-walled carbon nanotubes comprising on a substrate at least one pillar comprising alternate layers of a first precursor material comprising fullerene molecules and a second precursor material comprising a catalyst. A third aspect is a nanotube arrangement comprising a substrate and thereupon at least one crystal comprising a bundle of single-walled carbon nanotubes with essentially identical orientation and structure.

18 Claims, 4 Drawing Sheets

CRYSTALS COMPRISING SINGLE-WALLED CARBON NANOTUBES

BACKGROUND OF THE INVENTION

1. Field of the Invention

The invention includes a method of manufacturing single-walled carbon nanotubes by promoting self-assembly of single crystals of single-walled carbon nanotubes using field enhanced thermolysis of nano-patterned precursors. With the disclosed method a higher ordering degree of the grown nanotubes than with known methods can be achieved while the synthesis of these highly ordered single crystals of single-walled carbon nanotubes results in extended structures with length dimensions on the micron scale. They are formed from nanotubes that have identical diameter and chirality within each crystal but which may differ between the crystals. With the proposed method single-walled carbon nanotubes can be produced as a highly ordered bulk material on the micron scale which is a first step for the synthesis of bulk macroscopic crystalline material. The invention hence represents a significant advance in the synthesis of crystals containing a high number of well-aligned ordered single-walled carbon nanotubes all of which are physically identical in nature.

2. Description of the Related Art

Carbon nanotubes have been the subject of intense research since their discovery in 1991. One of the most desirable aims of carbon nanotube fabrication is to form large uniform and ordered nano- and microstructures and eventually bulk materials.

The potential applications of single-walled carbon nanotubes range from structural materials with extraordinary mechanical properties down to nanoelectronic components with a potential to circumvent Moore's Law. Single-walled carbon nanotubes can act as ultimate probe tips for scanned probe microscopy with the added ability to chemically functionalize the apex. These nanostructures are also usable for forming microbalances, gas detectors or even energy storage devices. Likewise the use of single-walled carbon nanotubes in the field emission mode for displays or as electrodes for organic light emitting diodes or for electron beam sources in lithography and microscopy are of clear future technological significance.

The growth of single-walled carbon nanotubes traditionally uses harsh conditions such as laser ablation of carbon rods or a direct current arc discharge between carbon electrodes in an inert gas environment, such as described in "Fullerene Nanotubes: $C_{1,000,000}$ and Beyond", Yakobson and Smalley, American Scientist, Vol. 85, No. 4, July–August 1997, pp. 324–337. For both methods the addition of a small quantity of metal catalyst like Co, Ni, Fe, or Mo increases the yield of single-walled carbon nanotubes. To date the resulting material consists however only of an entangled and poorly ordered mat of single-walled carbon nanotubes although each nanotube can be several hundreds of microns long. Furthermore, a wide variation in structures referred to as the zigzag, armchair or chiral forms coexist within the material. U.S. Pat. No. 5,424,054 presents a method for manufacturing hollow fibers having a cylindrical wall comprising a single layer of carbon atoms, but also here the produced fibers have no controlled orientation.

In a recent article "Carbon rings and cages in the growth of single-walled carbon nanotubes" by Ching-Hwa Kiang, Journal of Chemical Physics, Vol. 113, No. 11, 15 September 2000, a growth model for single-walled carbon nanotubes is presented based on an analysis of the experimental results of arc- and laser-grown single-walled carbon nanotubes.

In "Growth of a single freestanding multiwall carbon nanotube on each nanonickel dot", by Ren et al. in Applied Physics Letters, Vol 75, No. 8, 23. August 1999, pp. 1086–1088, the use of chemical vapor deposition in combination with nanofabricated catalytic patterning or templating has been used to direct the growth of individual single-walled carbon nanotubes on substrates. However, ordered arrays beyond short sections of ordered single-walled carbon nanotubes of tens of nanotubes have not been produced. Likewise, chirality and diameter are not controllable which for many applications is of paramount importance because the physical properties of the nanotubes such as electrical conductivity are extremely structure-sensitive.

SUMMARY OF THE INVENTION

According to a first aspect of the invention there is provided a method of manufacturing single-walled carbon nanotubes comprising the steps of providing on a substrate at least one pillar comprising alternate layers of a first precursor material comprising fullerene molecules and a second precursor material comprising a catalyst, and heating the at least one pillar in the presence of a first magnetic, electromagnetic or electric field. During the heating, crystals comprising single-walled carbon nanotubes grow. The crystal growth direction is determined by the direction of the applied field. The precursor materials can be provided by thermal evaporation. As the fullerene molecules $C_{60}$ or $C_{82}$ molecules can be preferably used.

It proves an advantageous choice to provide the pillars to have between 5 and 10 layers of the precursor materials deposited upon each other. Each layer may have a thickness between 5 and 30 nm.

The precursor materials can be deposited through a shadow mask comprising one or more apertures. Such a shadow mask has the advantage to be suited for not only providing an aperture for creating one pillar, but with such a shadow mask a large number of such pillars can be fabricated in parallel. Furthermore the fabrication of the apertures in the shadow mask can be done in parallel as well, e.g. by a lithography process.

The substrate can be selected to comprise thermally oxidized silicon or molybdenum in the form of a grid or as a solid film provided on a silicon wafer. The substrate can also be selected to have a rough faceted surface such that it offers crystallization sites, i.e. seed locations from where the crystals respectively the nanotubes can grow.

The substrate ideally is selected to have a surface structure that helps the pillars to stay confined also during the heating step. It is found that the better the confinement of the pillars on the surface, the higher the yield in precisely aligned crystals. The substrate is optimally selected, to not, or only to a negligible extent, participate in the chemical reaction that takes place during the heating step. It is further preferable to have the property to effectively keep the pillars confined thereon. A diffusion of the pillar structure on the surface reduces the yield. Molybdenum or silicon dioxide have been found to be materials for the substrate that meet with both of the above criteria. Particularly molybdenum is found to offer through its surface structure numerous crystallization sites. Instead of a bulk substrate, any layered structure comprising different materials can be used. For the manufacturing method, the upmost layer is the one that influences the process and which herein is referred to as the substrate.

The evaporation of the precursor materials can be performed at a pressure of around $10^{-9}$ Torr, while the substrate can be kept at room temperature. The evaporation can be controlled by using an electromechanical shutter and an in situ balance for monitoring the deposition rate of the precursor materials. The evaporation can be controlled such that the thickness of the layers decreases with their distance from the substrate. This decreasing thickness again increases the yield and it is believed that the reduction in thickness directly leads to the effect that less of the catalyst is transported towards the tip of the growing crystal. Furthermore the evaporation of a catalyst like Ni is technically not so easy which makes it desirable to utilize only the minimum necessary amount for the manufacturing process. Hence the amount of catalyst material can be reduced by the thinner layers. Since it is also believed that the growth of the crystal begins at the base of the pillar, less material transport form the layers which are remote from the substrate is performed with the layers with reduced thickness.

The heating can be performed up to a temperature of essentially 950° C. in a vacuum of essentially $10^{-6}$ Torr or in an essentially inert gas atmosphere, for a time between 3 minutes and an hour. Thereby better results are obtained. A heating time in the minute range is in principle seen sufficient which means that a longer heating does not significantly improve the result.

In the case of applying the first magnetic field, this magnetic field can be oriented essentially normal to the surface of the substrate during heating, such that the growing nanotubes follow the applied field and grow perpendicularly to the substrate surface as well. This field can be concentrated onto the at least one pillar being heated. This proves advantageous, when the heating source is constructed in a way that counteracts the applied field. Since at 950° C. the Curie temperature of a magnet is exceeded, the magnetic field in that heated area would be destroyed. Keeping the magnet away from the heat source such that the heat does not harm the magnet, but directing the field to the pillars allows to keep the magnetic field effective in the pillar area. In the case of growing more than one pillar, the first magnetic field can be applied in a different orientation onto different of the pillars, thereby effecting different crystals growing into different, but controlled, directions. Even crystal intersections can be achieved in this way. After the heating has led to the growth of the single-walled carbon nanotubes, these can be thermally annealed in the presence of a second magnetic field. During this process step, the crystal direction is again determined by the direction of the applied field. When the direction of the second magnetic field differs from the direction of the first magnetic field, the crystal is redirected into the new direction determined by the second applied field.

In the case of applying an electrical field, this electrical field can be directed essentially parallel to the substrate surface in order to have the nanotubes grow orthogonally to the substrate surface.

According to another aspect of the invention a precursor arrangement for manufacturing single-walled carbon nanotubes is provided, which comprises on a substrate at least one pillar comprising alternate layers of a first precursor material comprising fullerene molecules and a second precursor material comprising a catalyst. The layers may have a thickness that decreases with their distance from the substrate. The substrate may comprise thermally oxidized silicon or molybdenum in the form of a grid or as a solid film provided on a silicon wafer. The catalyst may comprise a magnetic material, preferably a metal being selected from the group Ni, Co, Fe, Mo.

According to another aspect of the invention a nanotube arrangement is proposed comprising a substrate and thereupon at least one crystal comprising a bundle of single-walled carbon nanotubes with identical orientation and structure. The nanotube arrangement can be integrated in a display, electrical circuit, switching element or sensor element.

A further aspect of the invention is to provide a nanotube crystal comprising a bundle of straight single-walled carbon nanotubes with essentially identical orientation and structure.

DESCRIPTION OF THE DRAWINGS

Examples of the invention are depicted in the drawings and described in detail below by way of example. It is shown in FIG. 1 a schematic view of an apparatus for manufacturing single-wall carbon nanotubes in an evaporation step, FIG. 2 a schematic view of an apparatus for manufacturing single-wall carbon nanotubes in a heating step, FIG. 3 a schematic view of a single pillar as precursor structure for manufacturing single-wall carbon nanotubes, FIG. 4a scanning electron microscope (SEM) micrograph of a crystal containing a bundle of single-wall carbon nanotubes, FIG. 4b a magnified portion of the SEM micrograph of FIG. 2a, FIG. 4c a schematic view of a bundle of single-wall carbon nanotubes, FIG. 5 scanning electron microscope (SEM) micrograph of a typical structure produced by the described method FIG. 6 an electron diffraction pattern from bundle with single-walled carbon nanotubes.

All the figures are for sake of clarity not shown in real dimensions, nor are the relations between the dimensions shown in a realistic scale.

DETAILED DESCRIPTION OF THE INVENTION

In the following, the various exemplary embodiments of the invention are described.

Crystals of single-walled carbon nanotubes are produced using a method involving nanoscale patterning of solid-state precursor materials. Controlled mixtures of fullerenes, here $C_{60}$ molecules and Nickel as catalyst are evaporated through nanometer-scale apertures of a patterned evaporation mask onto a molybdenum substrate. The resulting structures are then thermolysed under vacuum in the presence of a magnetic field. A combination of electron diffraction studies and electron energy loss spectroscopy (EELS) confirms that the produced structures are almost perfect rod-like crystals of single-walled carbon nanotubes oriented normal to the surface of the substrate.

Figure 1:
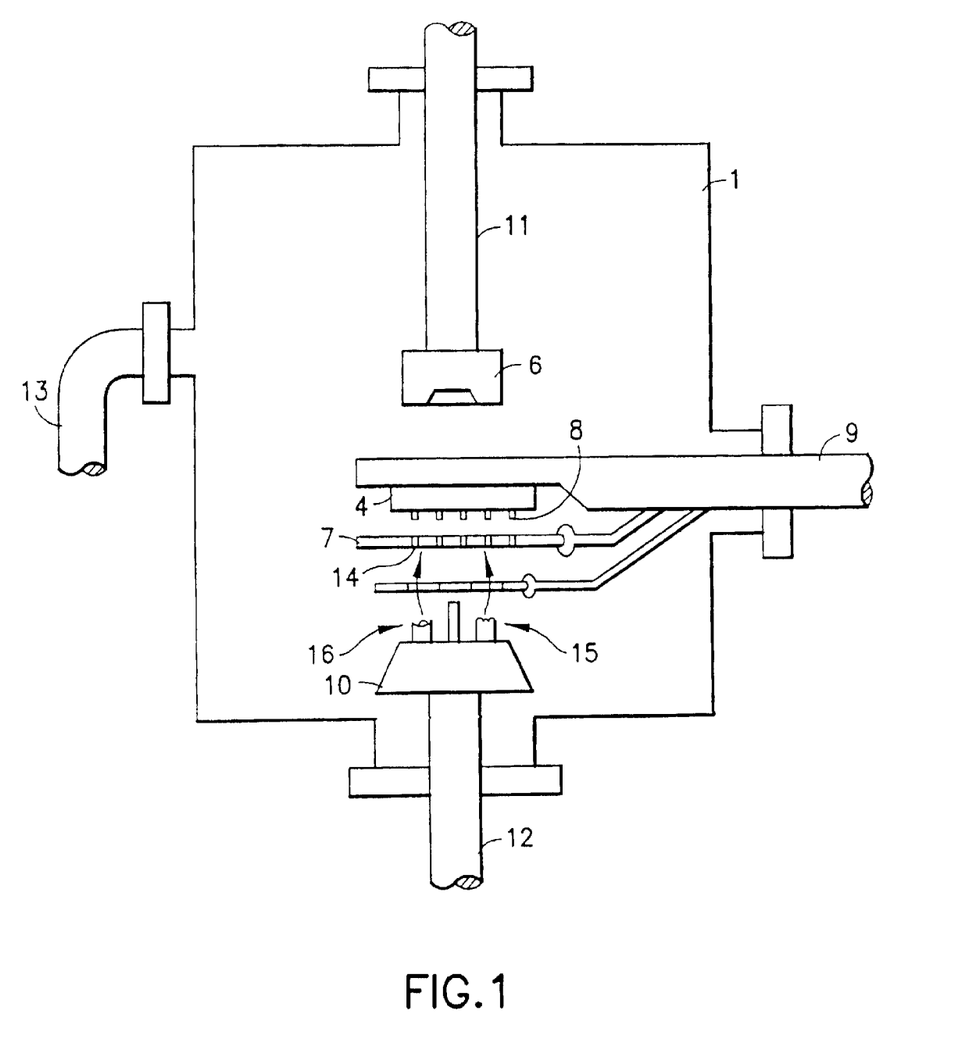

In FIG. 1 a first schematic view of an apparatus for manufacturing single-wall carbon nanotubes is depicted.

A reaction chamber 1 comprises four openings, one being penetrated by a sample-holder 9 for holding a substrate 4 and a patterned evaporation mask 7, also referred to as shadow mask, the second opening being penetrated by a first tool support 11, the third opening being penetrated by a second tool support 12. The fourth opening is provided with a hose 13 for evacuating the reaction chamber 1 and/or filling in some gas, such as an inert gas like Argon. Inert gases are suitable for avoiding the boiling of carbon dioxide from the carbon material provided. The first tool support 11 holds an oscillating quartz 6 serving as a microbalance for controlling the thickness of a deposited layer. The second tool support 12 holds an evaporation source 10. During operation the evaporation source 10 is emitting material through apertures 14 in the patterned evaporation mask 7 towards the substrate 4. The evaporation source serves for evaporating here two precursor materials 15, 16. Thereof a first precursor material 15 is a fullerene and a second precursor material 16 is a catalyst. The precursor materials 15, 16 may also comprise additional substances, as long as the crystal growth is achievable.

The evaporation is performed in a way that alternate layers of the precursor materials 15, 16 are deposited on the substrate 4. Therefor either the evaporation source 10 provides all the different precursor materials 15, 16 whose evaporation is controlled in an alternating fashion, or the evaporation source 10 serves only for depositing only one of the precursor materials 15, 16 and is then exchanged against another evaporation source 10 with the other of the precursor materials 15, 16. The depicted solution provides both precursor materials 15, 16 at the same time in that evaporators for both precursor materials 15, 16 are put side by side at the evaporation source 10 with an isolation wall between them. A shuttering mechanism is provided for alternately allowing only one of the precursor materials 15, 16 at each moment in time to arrive through the apertures 14 at the substrate 4. Thereby underneath each aperture 14 due to the subsequent deposition of layers of the evaporated precursor materials 15, 16, pillars 8 can grow on the substrate 4. For layer thickness control, the sample holder 9 is retracted while the oscillating quartz 6 is moved at the position where the substrate 4 is positioned during the evaporation step. An in situ measurement is performed while the quartz's frequency is monitored. Thus the exact deposition rate can be measured and used for determining the layer thickness for the precursor materials 15, 16 to be deposited on the substrate 4.

Figure 2:
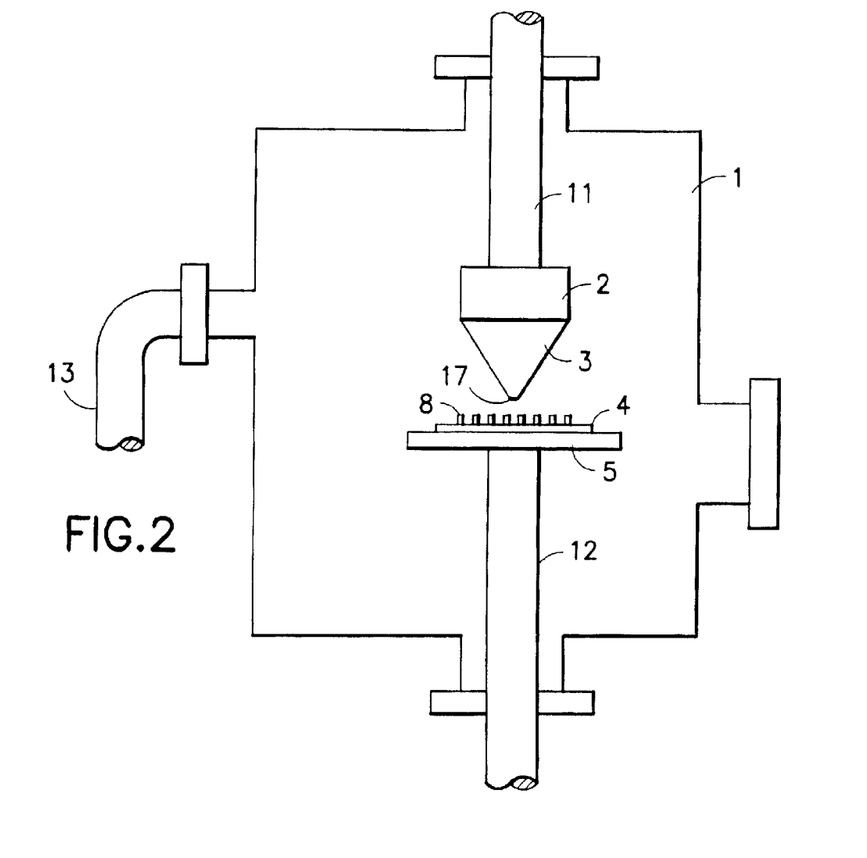

Once the desired deposition has been achieved and the substrate 4 is patterned with the resulting pillars 8, the apparatus is modified as depicted in FIG. 2. The second tool support 12 is altered to now hold a magnet 2 which either itself is pointed or, as depicted here, is combined with a pointed ferrite core 3, whereby the point is directed towards the substrate 4. With this arrangement the substrate 4 with the pillars 8 can be heated in the presence of a first magnetic field 17. The pointed magnet 2, respectively ferrite core 3, serves for concentrating the first magnetic field 17 onto the pillars 8 where the reaction converting the pillars 8 into the single-walled carbon nanotubes 19 is taking place. The field 17 provides the driving force for moving the catalyst along the field direction. This also holds true for the case when the field 17 is an electric field or an electromagnetic field.

Figure 3:
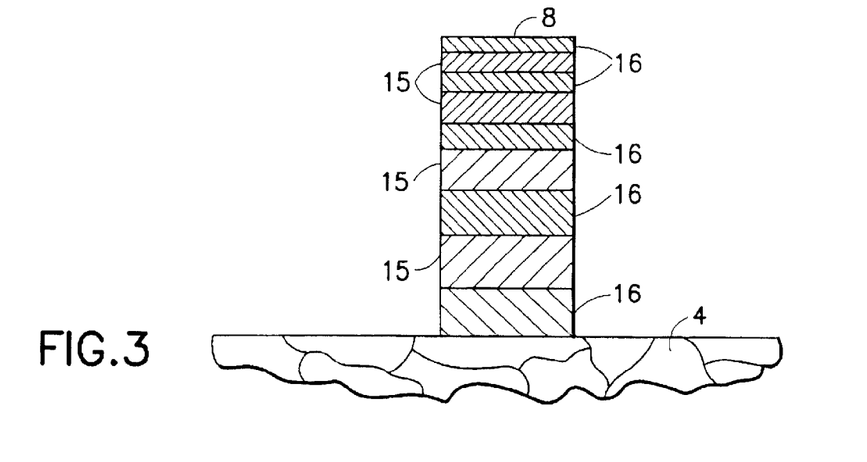

In FIG. 3 a schematic view of a single pillar 8 as precursor structure for manufacturing the single-wall carbon nanotubes 19 is shown. The precursor structure from which the nanotubes 19 are grown consists here of a hetero structure comprising alternate layers of $C_{60}$ molecules being the first precursor material 15 and Nickel being the second precursor material 16, thermally evaporated. Some 6 or 7 layers with thicknesses of 10–20 nm are deposited on top of each other. The precursor materials 15, 16 are deposited through the shadow mask 7, representing a sort of nano-sieve, having several thousand apertures 14 with a diameter of 300 nm and with a pitch of 1 micron. This method of deposition generates small nucleation sites that enable subsequent self assembly of the single-walled carbon nanotube crystals 20. Although instead of using the shadow mask 7 the material can also be deposited on a substrate 4 with a rough faceted surface, less nanotubes 19 are produced in preference to disordered platelets. In general, some seed location, i.e. nucleation site or crystallization site is the location where the crystal growth initiates.

It is found that in a structure where there is a nucleation site near the pillar 8, the pillar 8 serves only as material supply for the crystal 20 growing nearby. The pillar 8 has here a diameter of 300 nm but it can generally be stated that the lateral dimensions of the pillar 8 can be selected in a broader range. Although excellent results can be obtained with the 300 nm diameter, a bigger diameter like 500 nm or more should lead to acceptable results as well. The lateral dimensions of the pillars 8 determine the total amount of the precursor materials 15, 16 that are involved in the growth of the corresponding crystal 20. Each growing crystal 20 has hence its reservoir of precursor materials 15, 16 from which it gets its material supplied. The predetermination of the material supply has the effect that the different precursor materials 15, 16 used in the growth of the corresponding crystal 20 are predetermined in their amount and position. The movement of the molecules of the precursor materials 15, 16 is hence rather confined within the pillar area and a less chaotic movement leading to a more determined growth process can result therefrom. Also the concentration of the precursor materials 15, 16 relatively to each other can have a decisive effect, which means that the amount of the second precursor material 16 which is necessary for helping the first precursor material 15 to grow into the desired nanotube form, should neither be substantially exceeded nor substantially fallen below of. Again, the confinement of the precursor materials 15, 16 in their pillar 8, leads to a more precise ratio between the two precursor materials 15, 16 that contribute to the crystal growth of a single crystal 20.

Since the pillars 8 have also a certain predetermined distance from each other, a mutual disturbing effect of the growing crystals is reduced with respect to a bulk precursor material system. Hence growth of each single crystal 20 at its crystallization point is not or only negligibly interfered with by the growth process of an adjacent crystal 20. The pillars 8 have hence a distance from each other and this distance reduces the mutual interference of the growth process of the respective crystals, respectively nanotubes 19.

The pillars 8 have a lateral dimension such that the amount of the precursor materials 15, 16 is confined to provide the material for a single crystal 20 being a bundle of nanotubes 19. It is presumed that the stronger the applied field 17, the larger can be chosen the lateral dimensions of the pillars 8, since the force that directs the second precursor material 16 is stronger. The pillar shape need not be round or square in but can have any form that is deemed appropriate. For symmetry reasons the round shape is however preferred. The bundle may range from a few to several hundred, thousands or even millions of nanotubes 19.

It is possible to artificially grow the nucleation sites on the substrate 4 to enable controlled positioning of crystal growth. Such creation of nucleation sites can e.g. be achieved by evaporating through the evaporation mask 7 a material, e.g. tungsten, that can serve as nucleation site on the substrate 4. Since the evaporation mask 7 has a shadowing effect, an evaporator for the nucleation material which is situated sufficiently apart from the evaporators for the precursor materials 15, 16 automatically generates the nucleation sites near the pillars 8. In contrast, the evaporators for the precursor materials 15, 16 should be situated closely together in order to avoid a lateral misalignment of the various layers in the pillar 8, in that case, both evaporators are situated simultaneously in the reaction chamber 1.

During evaporation at a pressure of $10^{-9}$ Torr onto the solid substrate 4 of thermally oxidized silicon or a Mo TEM grid at room temperature, electromechanical shuttering combined with an in situ quartz crystal microbalance to monitor deposition rates, can be used to ensure that both $C_{60}$ and Ni can be evaporated sequentially to produce the desired structure.

As shown in FIG. 3, this produces a pillar 8 of precursor materials 15, 16 at a specific surface site determined by the relative position of the aperture 14 and the substrate surface. The choice of substrate 4 is influenced by the fact that both $C_{60}$ and Ni are able to diffuse at high temperatures and the aim is to constrain both materials within the original 300 nm evaporation area. Although good results can be achieved with the silicon dioxide substrate 4, better results can be obtained with a molybdenum substrate 4 either in the form of a grid for subsequent transmission electron microscopy, or as a solid film sputtered on to a silicon wafer. After evaporation of the $C_{60}$/Ni pillars 8 on the substrate 4, the arrangement is heated to 950° C. in a vacuum of $10^{-6}$ Torr for a time which is chosen to lie between a few minutes and an hour. Growth of the resulting nanotubes 19 is oriented normal to the substrate surface when the substrate 4 is immersed in the magnetic field 17 oriented parallel to the substrate surface normal during heat treatment. A field strength of ~1.5 Tesla is suitable to achieve the desired results. The application of an electric, electromagnetic or magnetic field 17 directs the self-assembly and organization of the single-walled carbon nanotube crystals 20. The electric field can be an AC or DC field. The electromagnetic field can also be an optical near field e.g. of a laser. Also atomic forces or Van der Waals forces may be applied during growth. Also possible is the application of an electronic potential that could change the field emission of tunneling processes such that the electron currents influence the crystal growth as in electromigration.

The material of the second precursor material 16 is directed into the direction of the applied field 17. Hence the field and the second precursor material 16 interact such that the second precursor material 16 has the property to be movable by the field 17. Such property can be that the second precursor material 16 is magnetic or bears an electric charge or a combination of both or has any other property that is influenced by the applied field 17 to exert a moving force on the second precursor material 16.

High-resolution TEM (HREM) studies performed in a JEOL 4000FX microscope operating at 400 kV, for carrying out a detailed diffraction analysis in a 200 kV JEOL 2010 microscope show nanotube bundles to be present with diameters varying between 40 nm and 900 nm with lengths up to 2 microns. The nanotubes 19 are straight and preferentially aligned parallel to the Mo-grid plane. All the nanotubes 19 are single-wall carbon nanotubes 19 forming long and straight bundles. The wall diameters in a bundle are remarkably uniform and range from about 1.4 nm to 2.3 nm in individual bundles. There is an inverse correlation between wall and bundle diameter in that small wall diameters are predominantly observed in large diameter bundles whereas large wall diameters are found in small diameter bundles. Neither multi-wall carbon nanotubes nor isolated single-wall nanotubes are present, the former being excluded on both the observed wall thickness and the absence of a core region.

Figure 4A:
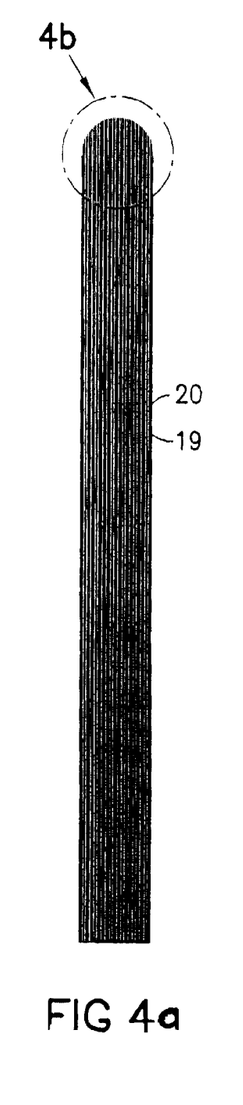
Figure 4B:
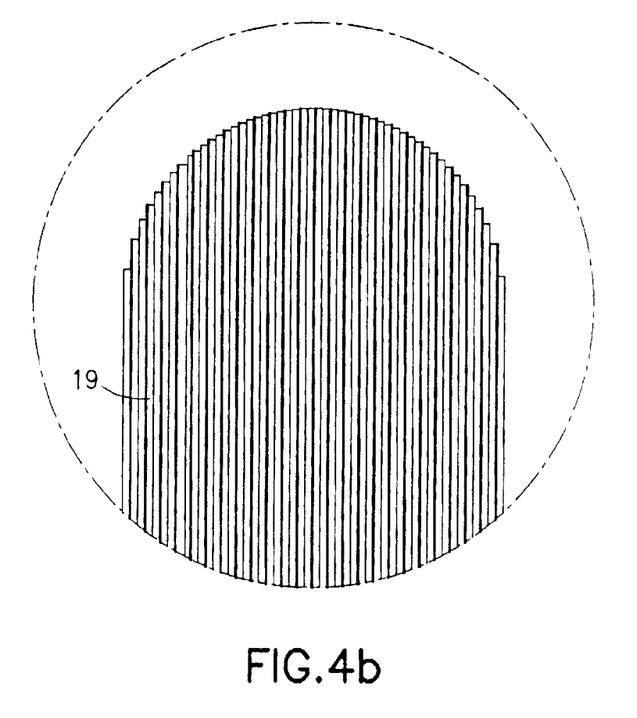

A typical HRTEM image of a bundle of nanotubes 19 is shown in FIG. 4a with a higher magnification image showing the internal structure of the nanotube bundle in FIG. 4b. The bundle is ~750 nm long and ~50 nm diameter with a curved end cap.

FIG. 4b shows the perfect regular arrangement of 1.6 nm diameter single-walled carbon nanotubes 19 in a bundle with no evidence of inhomogeneity or defect. This remarkable structural perfection is a characteristic of all nanotubes 19 produced using the described method.

Figure 4C:
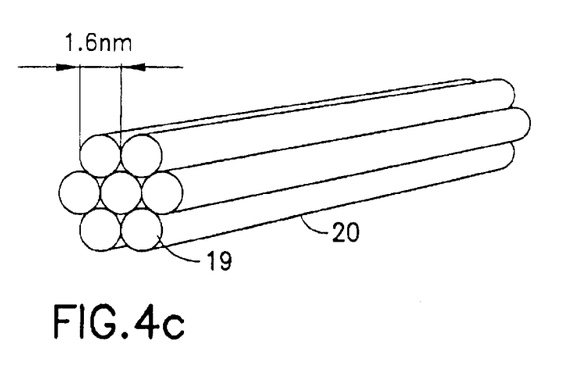

FIG. 4c shows a schematic view of a bundle of 7 nanotubes 19, as they are present in the result depicted in FIGS. 4a, 4b, the nanotubes 19 each having a diameter of 1.6 nm.

Figure 5:
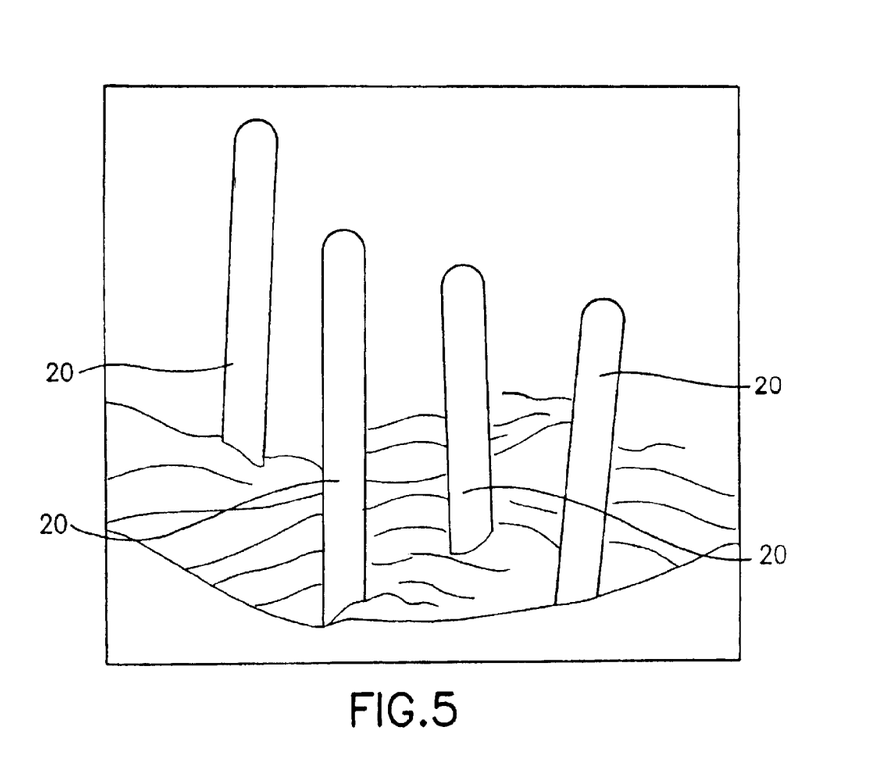

A scanning electron microscope (SEM) micrograph of a typical structure produced by the described method, depicted in FIG. 5, shows rod-like structures of approximately identical diameter and length with curved end caps have grown normal to the substrate surface. This result is typical of the structures produced with the only variability being the length and width of the rods. To confirm that the rods are carbon nanotube crystals 20, in the case they are grown on a Molybdenum grid both EELS giving the chemical composition, and electron diffraction, can be carried out. An EELS spectrum of a rod acquired in a VG 501HB STEM operating at 100 kV with a dispersion of 0.1 eV per channel at the Carbon-K edge shows an intense pre-peak at 285 eV just below the main absorption threshold. This pre-peak is a characteristic of the transitions to p* states in sp2-bonded carbon suggesting that graphite-like sheets are present in the nanotube 19. The spectrum closely resembles previous EELS spectra of carbon nanotubes 19 and confirms that they are indeed made of carbon. Importantly, the presence of Nickel in the EELS spectra is only detected during the growth phase of the nanotube 19 with no evidence of neither Nickel nor Molybdenum in the fully-grown nanotube 19.

Figure 6:
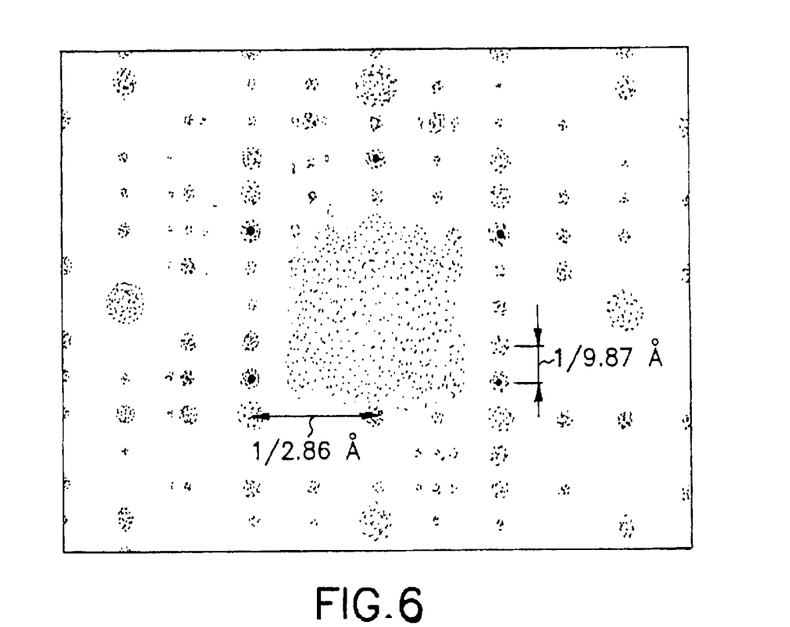

An electron diffraction pattern from a different bundle with single-walled carbon nanotubes 19 diameter 1.98 nm is shown in FIG. 6. The perfection of the structure is immediately obvious from the sharpness of the diffraction spots. The pattern indicates a highly regular periodicity due to the regular arrangement of nanotubes 19 in the bundle. In fact, more accurately, the bundle has to be considered as a periodic "crystal" of single-walled carbon nanotubes 19. Since this periodicity leads to strong reflections in the diffraction pattern, the weak diffraction spots and streaks containing the information about the individual nanotubes 19 almost disappear.

Referring to FIG. 6, two primary directions are indicated corresponding to the half single-walled carbon nanotubes wall width of 0.99 nm and orthogonal to this a spacing of 0.28 nm corresponding to the spacing of the graphite hexagons. The weak super reflections have a spacing that corresponds to the double of 0.28 nm.

There is a simple relationship between the diameter and helicity of individual nanotubes 19 specified in terms of a roll up vector (n,m) which arises from considering how an atom-thick graphite sheet can be rolled up to produce a nanotube. The diameter d and chiral angle q are given by:

$$d=0.078(n2+nm+m2)^{1/2}$$

and $q=\text{arc tan}(m/(m+2n))$

From FIG. 6 the chiral angle q is 90° and hence m=n. d is measured as 1.98 nm so that n=m=15 corresponding to a so-called armchair structure. For any crystal 20 of single-walled carbon nanotubes 19 the diffraction pattern indicates that it is made up of physically identical single-walled carbon nanotubes 19 of either chiral or armchair structure. A final structural observation is that relating to the shape of the individual crystals. Previous observations of bundles have demonstrated that the single-walled carbon nanotubes 19 are packed in a hexagonal structure looking towards the end of the bundle. Considering whether the equilibrium cross-sectional shape of a bundle would be circular, hexagonal or more complex in section, a simple argument based on a hexagonally packed structure of identical single-walled carbon nanotubes 19 favors a structure whose faces consist of close packed single-walled carbon nanotubes 19. This would include a hexagonal cross-section but could equally well be any cross-section consisting of 120° facets. The projected shapes of the bundles and the contrast in the HRTEM images indicate that faceting of the single-walled carbon nanotubes 19 crystals does indeed occur. The characteristics of self-assembled materials can be hence designed through nano-structuring of the reactants in three dimensions combined with programmed environmental changes.

The perfection of the crystals 20 of single-walled carbon nanotubes 19 and the observation that the nanotubes 19 are all physically identical within a given crystal 20 containing up to several million nanotubes 19 is unexpected, based on prior results and synthetic approaches in the field 17. Nevertheless, the most stable arrangement of bundles of nanotubes 19 meets with thermodynamic expectations of a minimum energy configuration over an extended array of nanotubes 19 in close contact. Minimization of energy also implies that all the nanotubes 19 be identical and straight, permitting maximization of the Van der Waals interactions, minimization of strain, and an expected hexagonal lattice. Evidence of faceting of the crystals 20 is another expectation that is indicated by the obtained results.

The nanotubes 19 respectively bundles thereof grown with the described method can be utilized in a number of devices such as switching devices, displays, or sensors. Depositing a layer of ITO and/or organic LED material on a layer of nanotubes 19 can be used to manufacture a display. Other embodiments comprise nanoelectronic circuits where nanotubes operate as active devices like FETs or as wiring. Also nanotube-based vacuum tube amplifiers and triodes with the nanotube acting as the emitter can be built, whereby the nanotube is used as a tip which provides stable low-voltage operation. Nanomechanical sensors and AFM tips can be supplied with a nanotube as sensor tip. Simply positioning the crystallization point where the later tip shall be located achieves the desired structure. The nanotube can be a movable part in switching devices or be integrated into a GMR head.

Any disclosed embodiment may be combined with one or several of the other embodiments shown and/or described. This is also possible for one or more features of the embodiments. It is obvious that a person skilled in the art can modify the shown arrangements in many ways without departing from the gist of the invention which is encompassed by the subsequent claims.

What is claimed is:

1. A precursor arrangement for manufacturing single-walled carbon nanotubes comprising:
   a substrate; and
   at least one pillar located on said substrate, said at least one pillar in turn comprising alternate layers of a first precursor material comprising fullerene molecules and a second precursor material comprising a catalyst.

2. The precursor arrangement according to claim 1, wherein the layers have a thickness that decreases with their distance from the substrate.

3. The precursor arrangement according to claim 1, wherein the substrate has at least one crystallization site for growing the single-walled carbon nanotubes.

4. The precursor arrangement according to claim 3, wherein said substrate comprises at least one of molybdenum and thermally oxidized silicon, wherein said molybdenum is in the form of at least one of a grid and a solid film provided on a silicon wafer.

5. The precursor arrangement according to claim 1, wherein the second precursor material comprises a magnetic material.

6. The precursor arrangement according to claim 5, wherein the magnetic material is selected from the group consisting of Ni, Co, Fe, Mo.

7. A nanotube arrangement comprising:
   a substrate comprising at least one of molybdenum and thermally oxidized silicon; and
   at least one crystal located on said substrate, said at least one crystal in turn comprising a bundle of single-walled carbon nanotubes with approximately identical orientation and structure.

8. The nanotube arrangement according to claim 7, wherein the substrate has a surface with crystallization sites wherefrom the single-walled carbon nanotubes have grown.

9. The nanotube arrangement according to claim 8, wherein said molybdenum is in the form of at least one of a grid and a solid film provided on a silicon wafer.

10. The nanotube arrangement according to claim 7 further comprising a plurality of said at least one crystals, wherein said plurality of said at least one crystals are substantially parallel to each other.

11. The nanotube arrangement according to claim 7 wherein the single-walled carbon nanotubes are substantially straight along their length.

12. A nanotube crystal comprising a bundle of straight single-walled carbon nanotubes with approximately identical orientation and diameter.

13. A display comprising:
    at least one nanotube arrangement, said at least one nanotube arrangement in turn comprising:
    a substrate comprising at least one of molybdenum and thermally oxidized silicon; and
    at least one crystal located on said substrate, said at least one crystal in turn comprising a bundle of single-walled carbon nanotubes with approximately identical orientation and structure.

14. An electrical circuit comprising:
    at least one nanotube arrangement, said at least one nanotube arrangement in turn comprising:
    a substrate comprising at least one of molybdenum and thermally oxidized silicon; and
    at least one crystal located on said substrate, said at least one crystal in turn comprising a bundle of single-walled carbon nanotubes with approximately identical orientation and structure.

15. A switching element comprising:
    at least one nanotube arrangement, said at least one nanotube arrangement in turn comprising:
    a substrate comprising at least one of molybdenum and thermally oxidized silicon; and
    at least one crystal located on said substrate, said at least one crystal in turn comprising a bundle of single-walled carbon nanotubes with approximately identical orientation and structure.

16. A display comprising:
    at least one nanotube crystal, said at least one nanotube crystal in turn comprising a bundle of straight single-walled carbon nanotubes with approximately identical orientation and diameter.

17. An electrical circuit comprising:

at least one nanotube crystal, said at least one nanotube crystal in turn comprising a bundle of straight single-walled carbon nanotubes with approximately identical orientation and diameter.

18. A switching element comprising:

at least one nanotube crystal, said at least one nanotube crystal in turn comprising a bundle of straight single-walled carbon nanotubes with approximately identical orientation and diameter.

* * * * *